United States Patent
Straub

(10) Patent No.: US 10,613,154 B2
(45) Date of Patent: Apr. 7, 2020

(54) REDUNDANT POWER SUPPLIES AND IN-FIELD TESTING

(71) Applicant: Charter Communications Operating, LLC, St. Louis, MO (US)

(72) Inventor: Albert W. Straub, Westminster, CO (US)

(73) Assignee: Charter Communications Operating, LLC, St. Louis, MO (US)

( * ) Notice: Subject to any disclaimer, the term of this patent is extended or adjusted under 35 U.S.C. 154(b) by 293 days.

(21) Appl. No.: 15/450,320

(22) Filed: Mar. 6, 2017

(65) Prior Publication Data

US 2018/0252777 A1   Sep. 6, 2018

(51) Int. Cl.

| G01R 31/00 | (2006.01) |
|---|---|
| G01R 31/30 | (2006.01) |
| G01R 31/36 | (2020.01) |
| G01R 19/00 | (2006.01) |
| G01R 19/165 | (2006.01) |
| H02J 9/06 | (2006.01) |
| G01R 31/40 | (2020.01) |

(52) U.S. Cl.
CPC .................. *G01R 31/40* (2013.01)

(58) Field of Classification Search
CPC ........ G01R 31/00; G01R 31/30; G01R 31/36; G01R 31/40; G01R 19/00; G01R 19/165; H02J 9/06
See application file for complete search history.

(56) References Cited

U.S. PATENT DOCUMENTS

| 4,879,624 | A | * | 11/1989 | Jones | H02H 3/021 |
|---|---|---|---|---|---|
| | | | | | 361/65 |
| 7,952,488 | B1 | * | 5/2011 | Zansky | G01R 31/40 |
| | | | | | 320/136 |
| 8,340,933 | B1 | | 12/2012 | King, Jr. et al. | |
| 9,548,627 | B1 | | 1/2017 | King, Jr. et al. | |
| 2009/0049337 | A1 | * | 2/2009 | Hsieh | G06F 1/263 |
| | | | | | 714/14 |
| 2009/0254768 | A1 | * | 10/2009 | Livescu | G06F 1/3203 |
| | | | | | 713/320 |
| 2011/0025129 | A1 | * | 2/2011 | Humphrey | G06F 1/263 |
| | | | | | 307/64 |
| 2013/0138365 | A1 | * | 5/2013 | Etaati | G01R 31/40 |
| | | | | | 702/58 |
| 2016/0181862 | A1 | * | 6/2016 | Humphrey | H02J 9/062 |
| | | | | | 307/64 |
| 2016/0294210 | A1 | * | 10/2016 | Nguyen | H02J 9/06 |

\* cited by examiner

*Primary Examiner* — Neel D Shah
(74) *Attorney, Agent, or Firm* — Armis IP Law, LLC

(57) ABSTRACT

According to one configuration, a redundant power supply includes a first power supply and a second power supply that collectively provide power to a (circuit) load during a non-test mode. During a power supply test mode, controller hardware in communication with the redundant power supply selects the first power supply for testing. The controller hardware disables failure reporting of the second power supply and then deactivates the second power supply. The controller hardware tests an ability of the first power supply to power the load while the second power supply is prevented from powering the load. If the first power supply is unable to individually power the load, the controller hardware provides notification to a respective target recipient to go forward with replacing and/or fixing the first power supply.

31 Claims, 11 Drawing Sheets

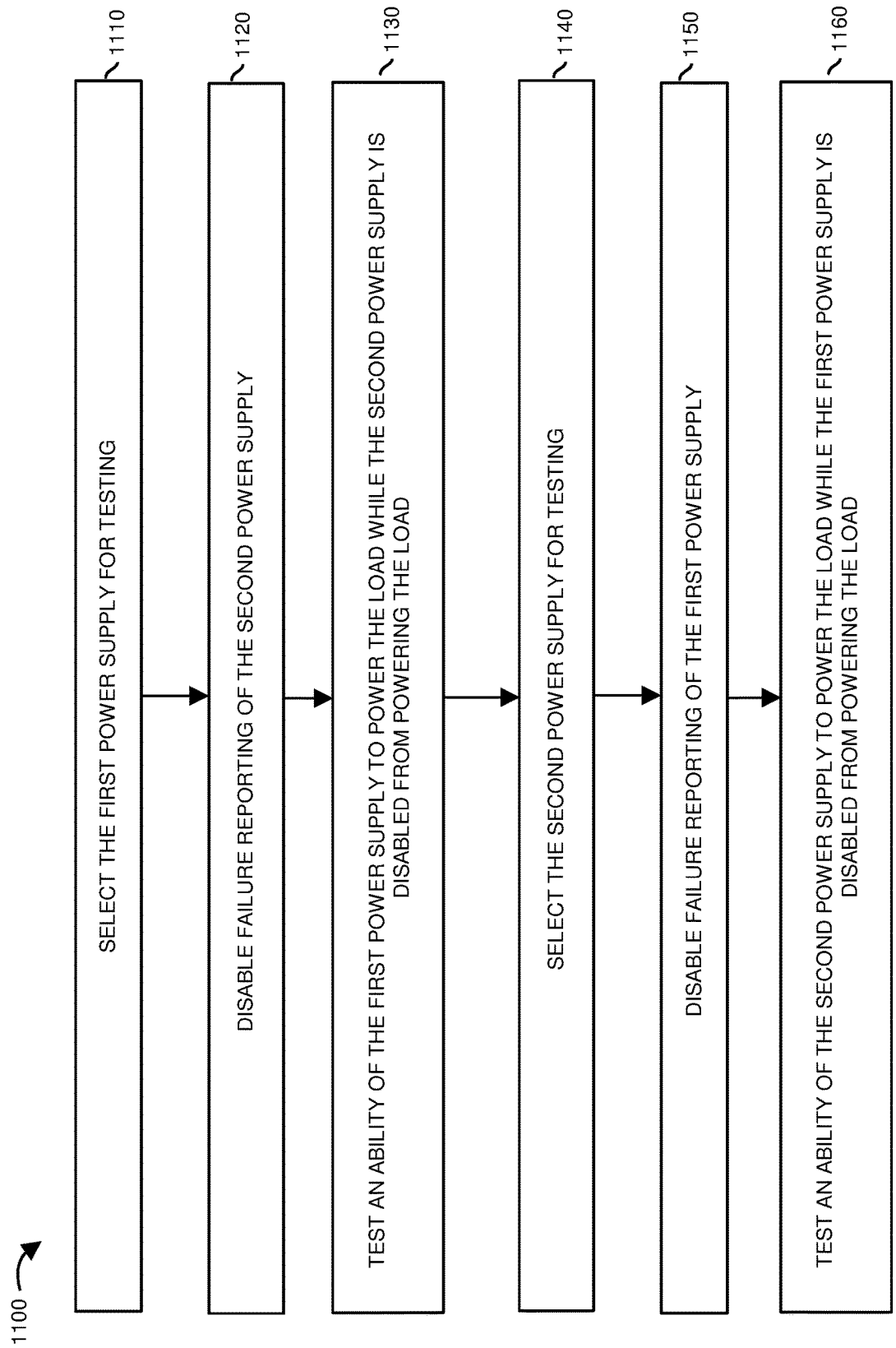

REDUNDANT POWER SUPPLIES AND IN-FIELD TESTING

BACKGROUND

So-called data centers are unique buildings designed specifically to house large numbers of computers. These special buildings are designed to provide environmental conditions conducive to computer interconnectivity, longevity, cooling, and power consumption. The computers that are stored in a data center are generally enclosed in standardized enclosures that mount in racks described by EIA-310-D, CEA-310-E, and sub-specifications of IEC 60297. Such computers within the 19-inch form factor are generally referred to as "servers" according to data center vernacular.

Since data centers may contain many servers, it is not possible to individually control or inspect each one of them. To allow the remote monitoring and control of each server, a so-called conventional Out-Of-Band (OOB) management component is provided. The OOB management component is powered independently of the server motherboard and thus remains active and available so long as external power is applied to the server. There is an evolving standard to interface to the OOB management system of servers called Red Fish™.

To provide higher reliability, computers in data centers typically contain multiple power supplies. The power supplies utilized within the computers are generally of a Switch Mode Power Supply (SMPS) type. The SMPS internal architecture utilizes an electronic switch, usually a semiconductor such as a transistor or diode, to rapidly turn on and off the input source of power. The switch is generally called a "chopper" in the power supply industry vernacular. In a "Buck Mode" SMPS, the input voltage is higher than the output voltage. Because the input voltage is generally greater than 100 volts and the computer semiconductors run at voltages between 1 and 12 volts, this is the most common type of SMPS used in servers. Buck mode SMPS are easily disabled by removing the signal that drives the switching device.

Switch mode power supplies utilize output capacitors to smooth out the converted voltage. The difference in the output signal between a pure Direct Current (DC) power source, such as a battery, and a rectified AC (Alternating Current) source is called the ripple voltage. The capacitance of the output capacitor, measured in Farads, plays a large part in the reduction of the voltage ripple. When the voltage across its terminals is high, charge enters the capacitor. When the voltage goes low, charge leaves the capacitor.

BRIEF DESCRIPTION OF EMBODIMENTS

For systems powered via redundant power supplies, the outputs are generally "ORed" to the load being supplied power. This is done either passively with diodes or actively using switches such as field effect transistors.

One drawback of conventional power systems is that in a circumstance in which each power supply of a redundant power supply provides 50% of the power required, there is no indication that either power supply has the ability to supply 100% of the power should one of the supplies fail.

For example, a typical scenario would be one in which a machine has been placed in service for several years with both power supplies operating independently of each other. Unknown to the system or a respective controller overseeing the system, one of the large aluminum electrolytic capacitors in the output filter of the power supply may lose most of its capacity and thus cannot support 100% of the load without introducing significant ripple. If both power supplies in a redundant power supply are from the same manufacturer, they may contain the same capacitor brand and type and thus be in the same operational condition over time. Should either of the power supplies fail at this point, and the other (presumably healthy) power supply attempts to take over individually powering the respective load without the other power supply, the power supply presumed to be healthy will fail as well resulting in neither of the power supplies being able to properly power the load.

Thus, even though a pair of redundant power supplies is collectively able to power a respective load, there is no indication that either of the power supplies will be able to successfully power the load while the other power supply is deactivated.

Embodiments herein provide novel ways of testing redundant power supplies and their ability to power respective load such as computer hardware, electronic circuitry, etc.

For example, in one embodiment, a redundant power supply includes a first power supply and a second power supply that collectively provide power to a load. During a first portion of a power supply test mode: controller hardware in communication with the redundant power supply selects the first power supply for testing. Because the first power supply has been selected for testing, the controller hardware disables failure reporting of the second power supply. The controller hardware then tests an ability of the first power supply to power the load while the second power supply is disabled from powering the load. If the first power supply is unable to individually power the load without power supplied by the second power supply, the controller hardware provides notification to a respective target recipient to go forward with replacing and/or fixing the first power supply.

Conversely, if the first power supply passes a respective test of powering the load while the second power supply is disabled, the controller hardware continues with a second portion of the power supply test mode.

In the second portion of the power supply test mode, the controller hardware activates the second power supply to power the load again and selects the second power supply for testing. Because the second power supply has been selected for testing, the controller hardware disables failure reporting of the first power supply. The controller hardware then tests an ability of the second power supply to power the load while the first power supply is disabled from powering the load. If the second power supply is unable to individually power the load while the first power supply is disabled, the controller hardware provides notification to a respective target recipient to go forward with replacing and/or fixing the second power supply.

Conversely, if the second power supply passes a respective test of powering the load, the controller hardware provides notification to a respective target recipient that the redundant power supply operates properly and activates the first power supply again to power the load along with the second power supply.

Embodiments herein are useful over conventional techniques. For example, a redundant power supply including a first power supply and a second power supply can be simultaneously operated to provide power to a respective load. Even though each of the first power supply and the second power supply may be designed to individually power the respective load during a failure condition in which one of the power supply fails, it is possible that one or both of the power supplies experiences an undetected failure in which either or both of the power supplies are unable to individually power a load without the other. As discussed herein, controller hardware individually tests each of one or more power supplies in a redundant power system to ensure that, in the event of a respective failure associated with one of the power supplies, the other non-failing power supply will be able to continue providing uninterrupted power to the load.

These and other more specific embodiments are disclosed in more detail below.

Any of the resources as discussed herein can include one or more computerized devices, mobile communication devices, servers, base stations, wireless communication equipment, communication management systems, workstations, handheld or laptop computers, or the like to carry out and/or support any or all of the method operations disclosed herein. In other words, one or more computerized devices or processors can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to a method, system, computer program product, etc., that supports operations as discussed herein.

One embodiment includes a computer readable storage medium and/or system having instructions stored thereon to facilitate testing of a redundant power supply. The instructions, when executed by computer processor hardware, cause the computer processor hardware (such as one or more processor devices) to: during a first portion of a power supply test mode: select the first power supply for testing, disable failure reporting of the second power supply, and test an ability of the first power supply to power the load while the second power supply is disabled from powering the load. During a second portion of the power supply test mode, execution of the instructions cause the computer processor hardware to: select the second power supply for testing, disable failure reporting of the first power supply, and test an ability of the second power supply to power the load while the first power supply is disabled from powering the load.

The ordering of the steps above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

As discussed herein, techniques herein are well suited for use in the field of controlling a remote media system. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention (s), the reader is directed to the Detailed Description section (which is a summary of embodiments) and corresponding figures of the present disclosure as further discussed below.

BRIEF DESCRIPTION OF THE DRAWINGS

FIG. 11 is an example diagram illustrating a method according to embodiments herein.

Figure 1:
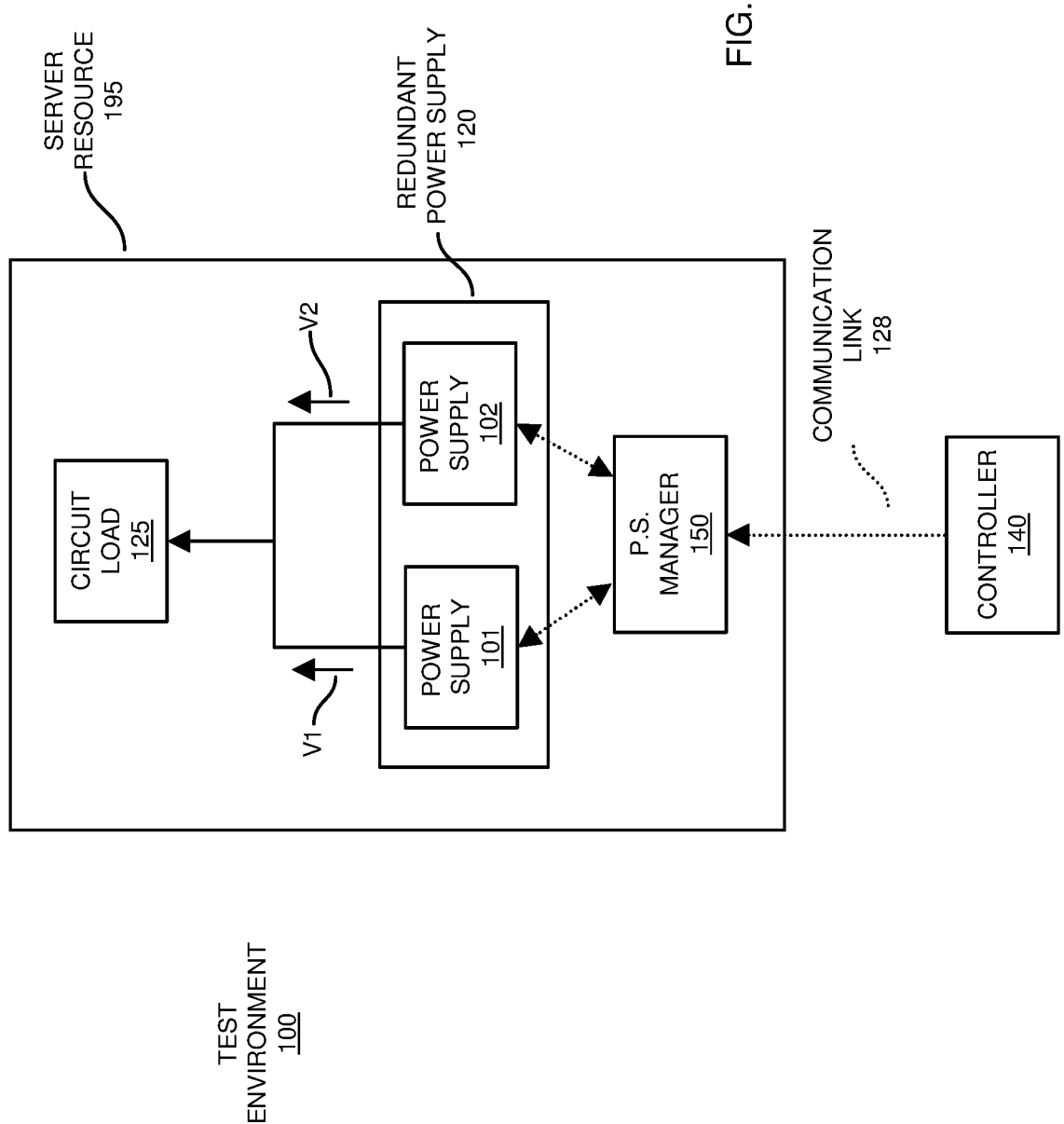
FIG. 1 is an example diagram illustrating a block diagram of hardware/software resources to test a redundant power supply according to embodiments herein.

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

According to one configuration, a redundant power supply includes a first power supply and a second power supply that collectively provide power to a (circuit) load during a non-test mode. During a power supply test mode, controller hardware in communication with the redundant power supply selects the first power supply for testing. The controller hardware disables failure reporting of the second power supply and then deactivates (powers down) the second power supply. The controller hardware tests an ability of the first power supply to power the load while the second power supply is prevented from powering the load. If the first power supply is unable to power the load under these test conditions, the controller hardware provides notification to a respective target to log the failure and go forward with replacing and/or fixing the first power supply (or replacing the whole failing redundant power supply).

In a similar manner, the controller hardware tests the ability of the second power supply to individually provide power to the load. For example, the controller hardware in communication with the redundant power supply selects the second power supply for testing. The controller hardware disables failure reporting of the first power supply and then deactivates the first power supply. The controller hardware tests an ability of the second power supply to power the load while the first power supply is prevented from powering the load. If the second power supply is unable to power the load under these test conditions, the controller hardware provides notification to a respective target recipient to go forward with replacing and/or fixing the second power supply (or replacing the whole failing redundant power supply).

Now, more specifically, FIG. 1 is an example diagram illustrating a functional block diagram of hardware/software resources to test a redundant power supply according to embodiments herein.

As shown, test environment 100 includes a server resource 195 and controller 140. The server resource 195 includes a circuit load 125 (such as processor hardware, communication interface hardware, etc., of server resource 195) powered by a respective redundant power supply 120. Redundant power supply 120 includes power supply 101 that produces voltage V1 and power supply 102 that produces voltage V2.

In one embodiment, the output of power supply 101 is directly (electrically) connected to the output of power supply 102 such that the combined voltage and current outputs of the power supply 101 and power supply 102 power the circuit load 125. During operation, by way of non-limiting example, each power supply (101 and 102) delivers approximately 50% of the power required to power the circuit load 125. If one of the power supplies in redundant power supply 120 is unable to produce a respective output voltage and deliver power to the circuit load 125, the other power supply is required to output 100% of the power needed to power the circuit load 125.

Note that the controller 140 shown in FIG. 1 can reside at a remote location with respect to the server resource 195. Via communications over the communication link 128 (such as a combination of one or more wireless links, wired communication links, network connections, etc.) to the power supply manager 150, the controller 140 is able to control the redundant power supply 120 and retrieve status information associated with the power supply 101 and power supply 102.

Status information received from the power supply manager 150 can include any suitable information such as the temperature of each power supply, magnitude of voltage V1, magnitude of voltage V2, current supplied by each of the power supplies to the circuit load 125, etc.

As its name suggests, the redundant power supply 120 includes multiple power supplies to ensure powering of the circuit load 125 even if a failure occurs with respect to one of the power supplies in the redundant power supply 120.

For example, in theory, if the power supply 101 fails and becomes unable to produce output voltage V1 to power the circuit load 125, the power supply 102 continues to output voltage V2 to power the circuit load 125. Conversely, if the power supply 102 fails and becomes unable to produce output voltage V2, the power supply 101 will continue to output voltage V1 to power the circuit load 125.

As previously discussed, embodiments herein can include individually and automatically testing that each of the power supplies in the redundant power supply 120 is able to provide power to the circuit load 125.

For example, in one general embodiment, during a first portion of a power supply test mode, the controller 140 selects the first power supply 101 for testing. To test the first power supply 101, via communications over the communication link 128 to the power supply manager 150, the controller 140 notifies the power supply manager 150 to disable failure reporting of errors associated with the second power supply 102. Additionally, the controller 140 communicates a command to the power supply manager 150 to deactivate the power supply 102 such that only the power supply 101 supplies power to the circuit load 125.

After such time when the power supply 102 is deactivated, the controller 140 tests an ability of the first power supply 101 to power the load 125 while the second power supply 102 is disabled from powering the load 125. To this end, in one embodiment, verification of the power supply 101 can include communicating with the power supply manager 150 to monitor one or more attributes (such as voltage magnitude, supply current magnitude, temperature, etc.) of the power supply under test (power supply 101 in this example).

In one embodiment, the controller 140 and/or power supply manager 150 is operable to execute a test monitor loop in which the power supply 101 under test is tested for a selected amount of time. As further discussed below, the monitor loop can include: i) testing a magnitude of the voltage V1 and/or current produced by the power supply 101 to power the load 125 as well as ii) testing a temperature of the power supply 101.

During testing of the power supply 101, if the controller 140 receives feedback (status information) from the power supply manager 150 indicating that the voltage magnitude of V1 (or any one of multiple monitored voltages) of the supply under test (power supply 101) exceeds a preset high voltage threshold value, then controller 140 notifies the power supply manager 150 to shut off the redundant power supply 120 to prevent damage to the load 125. If desired, the controller 140 provides notification to a respective target recipient of the failure condition.

During further testing of the power supply 101, if the controller 140 receives feedback from the power supply manager 150 that the voltage magnitude of V1 (or any one of multiple monitored voltages) of the supply under test is below a preset low voltage threshold value, then controller 140 notifies the power supply manager 150 to shut off the redundant power supply 120. The controller 140 provides notification to a respective target recipient of the failure condition.

During yet further testing of the power supply 101 during a loop or window, if the controller 140 receives feedback from the power supply manager 150 that the temperature of the power supply 101 under test exceeds a preset high temperature threshold value, then controller 140 notifies the power supply manager 150 to shut off the redundant power supply 120. The controller 140 then provides notification to a respective target recipient of the failure condition.

In one embodiment, the controller 140 breaks out of a loop of repeatedly testing attributes (voltage, current, temperature, etc.) of the first power supply 101 (as indicated by corresponding status information received from the power supply manager 150) in response to detecting a failure associated with the first power supply 101 during delivery of power from the first power supply 101 to the circuit load 125.

Accordingly, in the event that the controller 140 receives feedback from the power supply manager 150 of one or more failure conditions associated with the power supply 101 powering circuit load 125, the controller 140 is operable to break out of a test loop and provide appropriate notification such that a respective technician or administrator is notified to replace the failing redundant power supply 120 with a non-failing redundant power supply.

In the event that there are no failure conditions associated with the power supply 101 powering the circuit load 125 while the power supply 102 is deactivated, the controller 140 activates the power supply 102 again such that both the first power supply 101 and the second power supply 102 simultaneously power the circuit load 125 again.

In accordance with further embodiments, the controller 140 then initiates testing of the power supply 102 and its ability to provide power to the circuit load 125 while the power supply 101 is disabled.

More specifically, during a second portilon of a power supply test mode, the controller 140 selects the second power supply 102 for testing. To test the second power supply 102, via communications over the communication link 128 to the power supply manager 150, the controller 140 notifies the power supply manager 150 to disable failure reporting of errors associated with the first power supply 101. Additionally, the controller 140 communicates a command to the power supply manager 150 to deactivate the power supply 101 such that only the power supply 102 and corresponding voltage V2 supplies power to the circuit load 125.

During such time when the power supply 101 is deactivated, the controller 140 tests an ability of the second power supply 102 to power the load 125. To this end, in one embodiment, verification of the power supply 102 can include communicating with the power supply manager 150 to monitor one or more attributes (such as voltage magnitude, supply current, temperature, etc.) of the power supply under test (power supply 102 in this example). In one embodiment, the controller 140 and/or power supply manager 150 execute a monitor loop in which the power supply 102 and corresponding one or more parameters as discussed herein are repeatedly tested for a selected amount of time. As further discussed below, the monitor loop can include testing a magnitude of the voltage V2 produced by the power supply 102, testing a temperature of the power supply 102, testing an amount of current produced by the power supply 102 to power load 125, etc.

During testing of the power supply 102, if the controller 140 receives feedback from the power supply manager 150 of a failure such as that the voltage magnitude of V2 (or any one of multiple monitored voltages) of the supply under test (power supply 102) exceeds a preset high voltage threshold value, then controller 140 notifies the power supply manager 150 to shut off the redundant power supply 120 to prevent possible or further damage to the load 125. The controller provides notification of the failure condition to a respective target recipient to take corrective action.

During further testing of the power supply 102, if the controller 140 receives feedback from the power supply manager 150 that the voltage magnitude of V2 (or any one of multiple monitored voltages) of the supply under test is below a respective preset low voltage threshold value for the monitored attribute, then controller 140 notifies the power supply manager 150 to shut off the redundant power supply 120. The controller 140 provides notification to a respective target recipient of the failure condition.

During yet further testing of the power supply 102, if the controller 140 receives feedback from the power supply manager 150 that the temperature of the power supply under test exceeds a preset high temperature threshold value, then controller 140 notifies the power supply manager 150 to shut off the redundant power supply 120. The controller 140 then provides notification to a respective target recipient of the failure condition.

In one embodiment, the controller 140 breaks out of a loop of repeatedly testing or monitoring attributes (such as voltage, current, temperature, etc.) of the first power supply 101 (as indicated by corresponding status information received from the power supply manager 150) in response to detecting a failure associated with the first power supply 102 during a test mode of delivering power from the second power supply 102 to the circuit load 125.

Accordingly, in the event that the controller 140 receives feedback from the power supply manager 150 of one or more failure conditions associated with the power supply 102 providing sole power to circuit load 125, the controller 140 provides appropriate notification of the failure condition, enabling a respective technician to replace the failing redundant power supply 120 with a non-failing redundant power supply.

Figure 2:
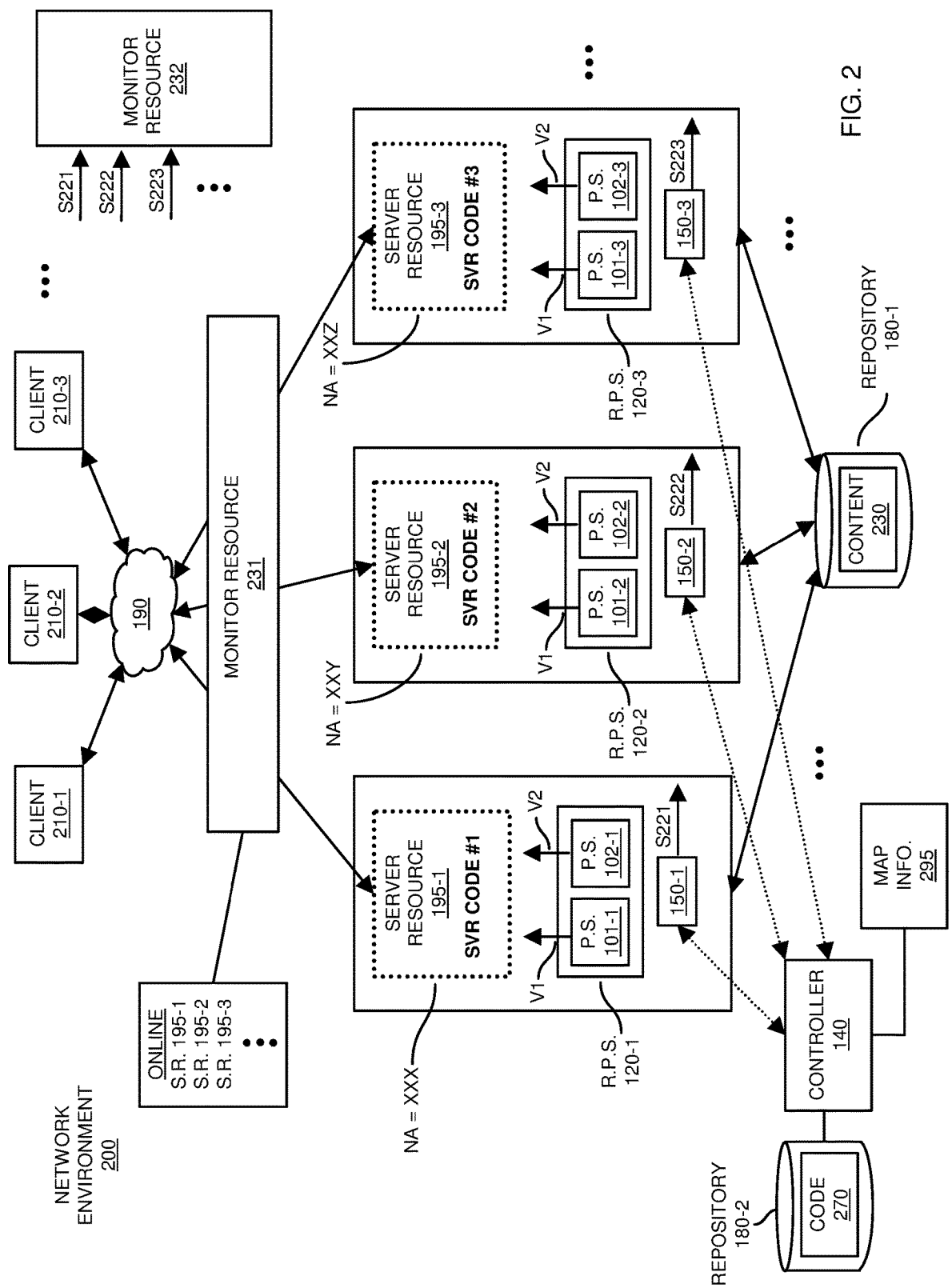
FIG. 2 is an example diagram of a communication system of multiple servers powered by respective redundant power supplies according to embodiments herein.

FIG. 2 is an example diagram of a communication system of multiple servers powered by respective redundant power supplies according to embodiments herein.

In this example embodiment, network environment 200 includes multiple servers including server resource 195-1, server resource 195-2, server resource 195-3, etc.

Each server resource is powered by a respective redundant power supply. For example, server resource 195-1 is powered by redundant power supply 120-1; server resource 195-2 is powered by redundant power supply 120-2, server resource 195-3 is powered by redundant power supply 120-3; and so on.

Network environment 200 further includes multiple clients including client 210-1, and client 210-2, claim 210-3, etc. (collectively referred to as clients 210).

Each of the clients 210 is able to transmit a respective request for content 230 stored in repository 180-1 through monitor resource 231. In one embodiment, monitor resource 231 is a load balancer that balances distribution of a request to each of the multiple server resources 195 so that none of the servers are overloaded with receiving and processing requests for content.

Figure 3:
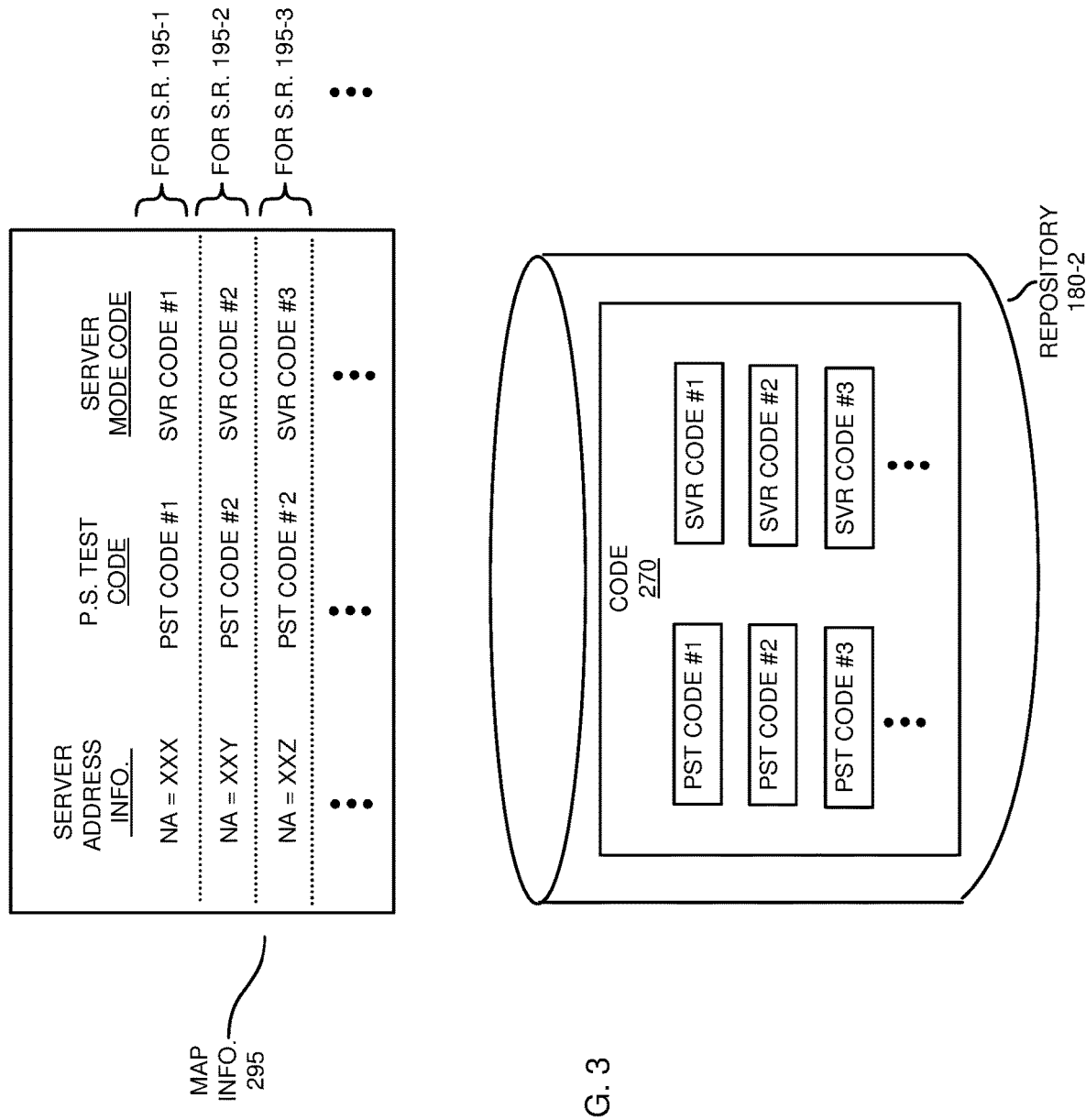
FIG. 3 is an example diagram illustrating mapping information and code assigned to each of multiple server resources according to embodiments herein.

Network environment 200 includes controller 140 (hardware and/or software). In one embodiment, the controller 140 controls operation of the server resources 195 based at least in part on the map information 295 as shown in FIG. 3. For example, map information 295 maps a respective identity of the server (network address information) to corresponding power supply test code and server code associated with each of the server resources.

As further shown in FIG. 3, the repository 180-2 accessible to the controller 140 stores software code 270. Each set of code includes one or more software instructions for execution by the server resource to which the code is assigned.

For example, repository 180-2 stores PST CODE #1 (power supply test code assigned for execution by server 195-1 during testing of redundant power supply 120-1), repository 180-2 stores PST CODE #2 (power supply test code assigned for execution by server 195-2 during testing of redundant power supply 120-2), etc.

As shown, in certain instances, such as for server resource 195-2 and server resource 195-3, the same power supply test code PST CODE #2 can be used to test such service. Additionally, each of multiple servers or each server can be assigned different power supply test code for execution during power supply testing.

In addition to storing power supply test code, the repository 180-2 also stores code for execution by each of the respective servers to perform serving operations when operating in normal mode. For example, repository 108-2 stores SVR CODE #1 (standard server code assigned for execution by server 195-1 to provide normal operation of serving content 230 in repository 180-1 to one or more of the clients 210); repository 108-2 stores SVR CODE #2 (standard server code assigned for execution by server 195-2 to provide normal operation of serving content 230 in repository 180-1 to one or more of the clients 210); repository 180-2 stores SVR CODE #3 (standard server code assigned for execution by server 195-1 to provide normal operation of serving content 230 in repository 180-1 to one or more of the clients 210); and so on.

During operation, the map information 295 enables the controller 140 to identify which code 270 stored in the repository 180-2 to load into the respective server to perform a desired operation (such as testing of redundant power supplies or operating in a normal content distribution mode).

Referring again to FIG. 2, the controller 140 communicates with each of the server management resources 150 in order to control respective operation of server resources and redundant power supplies.

For example, the controller 140 is in communication with server management resource 150-1 over communication link 228-1. Via communications over the respective communication link 228-1 to server management resource 150-1, the controller 140 is able to load code in the respective server resource 195-1 for execution. As shown in this example, based on mapping of the network address XXX to SVR CODE #1 as indicated by map information 295, the controller 140 communicates SVR CODE #1 over the communication link 228-1 for execution by the server resource 195-1. The controller 140 activates the redundant power supply 120-1 to provide appropriate power to the server resource 195-1.

As previously discussed, the respective first power supply 101-1 and the power supply 102-1 collectively provide power to the server resource 195-1.

In a similar manner, the controller 140 communicates with the server management resource 150-2 over communication link 228-2 to load SVR CODE #2 for execution by the server resource 195-2; the controller 140 communicates with the server management resource 150-3 over communication link 228-3 to load SVR CODE #3 for execution by the server resource 195-3; and so on.

Accordingly, via controller 140 or other suitable resource, embodiments herein include configuring multiple server resources 195 including a first server resource 195-1, a second server resource 195-2, a server resource 195-3, etc., to distribute content to clients 210 in a network environment 200. Each of the multiple server resources 195 has shared access to the content 230 for distribution to the clients 210.

In this example embodiment shown in FIG. 2, the monitor resource 231 receives communications from controller 140 or communications from the server resources themselves that the currently online servers includes: server resource 195-1, server resource 195-2, server resource 195-3, etc. Accordingly, in one embodiment, to provide load-balancing, when the monitor resource 231 receives requests from respective clients 210, the monitor resource 231 forwards the respective requests for content to the server resources in a balanced manner.

Each of the server resource 195 retrieves requested content 230 from repository 180-1 and forwards it to the appropriate requesting client.

Note that each respective server management resource (such as server management resource 150-1, server management resource 150-2, server management resource 150-3, etc.) can be configured to monitor a status of a respective redundant power supply, server resource, etc.

For example, each of the server management resources communicates respective status information (such as respective status information as S221, S222, S223, etc.) to any of one or more target devices such as monitor resource 232. For example, server management resource 150-1 communicates status information S 221 to the monitor resource 232; server management resource 150-2 communicates status information such as S222 to the monitor resource 232; so on.

In one embodiment, the server management resources 150 communicate respective status information using SNMP (Simple Network Management Protocol) communications, although any suitable technique can be used to distribute status information.

Via receipt of status information (such as status information S221, S222, S223,), the monitor resource 232 is able to identify a corresponding status of a server resource and respective redundant power supply. For example, via status information S 221, the monitor resource 232 is able to identify whether the redundant power supply 120-1 is operating correctly, whether there are any failures associated with server resource 195-1, etc.; via status information S222, the monitor resource 232 is able to identify whether the redundant power supply 120-2 is operating correctly, whether there any failures associated with the server resource 195-2, etc.; and so on.

As previously discussed, each redundant power supply includes a power supply to power the respective server resource. For example, redundant power supply 120-1 includes power supply 101-1 and power supply 102-1. During normal operation, such as when the server resource 195-1 executes respective code SVR CODE #1 to distribute requested content to the clients want 210, both the power supply 101-1 in the power supply 102-1 share a task of powering the respective server resource 195-1. In the event of a failure of a power supply in the redundant power supply 120-1, in theory, the non-failing power supply will continue to provide uninterrupted power to the respective server resource 195-1. Each of the redundant power supplies operates in a similar manner such that a respective server continues to operate even though one of the power supplies in a redundant power supply happens to fail.

Embodiments herein include occasionally or periodically testing each of the respective redundant power supplies to ensure that each of the power supplies is able to individually power the server resource. As further discussed below, this can include taking a respective server resource off-line and then performing a novel testing of the redundant power supply.

Figure 4:
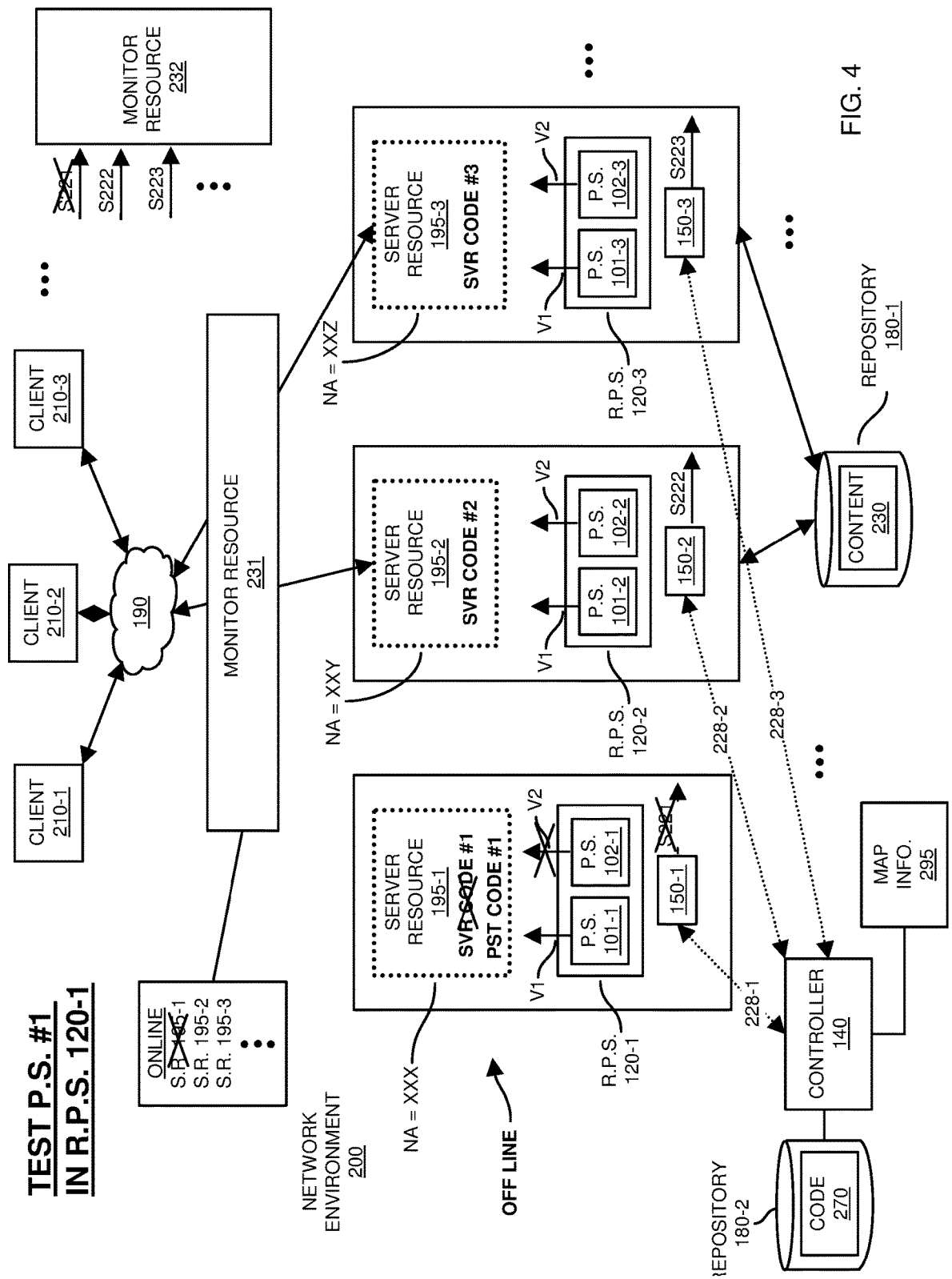
FIG. 4 is an example diagram illustrating testing of a first portion of a redundant power supply according to embodiments herein.

FIG. 4 is an example diagram illustrating testing of a first portion of a redundant power supply according to embodiments herein.

In one embodiment, as previously discussed, controller 140 occasionally or periodically tests each of the redundant power supplies to ensure that they are operating properly.

Assume in this example, that the controller 140 selects redundant power supply 120-1 powering the first server resource 195-1 for testing. As previously discussed, one or both of the power supply 101-1 or power supply 102-1 of the redundant power supply 120-1 is designed to individually power the respective server resource 195-1 (load).

Prior to executing a test with respect to the redundant power supply 120-1, the controller 140 notifies monitor resource 231 (such as a load balancer) that the first server resource 195-1 will be taken off-line from distributing the content 230 to the requesting clients 210 in order to test the redundant power supply 120-1.

In response to receiving the notification, after completing attending to pending requests for content, the monitor resource 231 removes the server resource 195-1 as an available candidate for distributing content 230 to respective clients. Providing notification to the monitor resource 231 that the server resource 195-1 is being taken off-line ensures that the monitor resource 231 does not generate erroneous failure information associated with the server resource or resource 195-1 and/or redundant power supply 120-1 during a test mode of testing the redundant power supply 120-1.

In addition to notifying the monitor resource 231 to prevent the monitor resource 231 from promulgating potentially erroneous errors to other resources, the controller 140 communicates with the server management resource 150-1 to notify the server management resource 150-1 that the redundant power supply 120-1 is being placed in a test mode. In response to receiving the notification, the server management resource 150-1 discontinues outputting status information S221, which indicates the health status of the redundant power supply 120-1. In other words, the controller 140 notifies the first server 195-1 to discontinue reporting any detected errors associated with the first power supply during the testing of the first power supply 101-1 and/or redundant power supply 120-1.

Accordingly, this preemptive move of disabling error message notification ensures that the server management resource 150-1 or any other resource in network environment 200 will not send out erroneous (or meaningless) failure messages during the testing of the redundant power supply 120-1.

Via further communications over communication link 228-1, the controller 140 then initiates downloading of PST CODE #1 to the server resource 195-1 for execution during the power supply test mode.

Additionally, during the power supply test mode, in accordance with commands from the controller 140, the server resource 195-1 switches from an operational mode of executing SVR CODE #1 to serve clients 210 content 230 to operating in a power supply test mode in which the server resource does not serve the content 230 to the clients 210 but instead executes PST CODE #1 to test the redundant power supply 120-1.

In one embodiment, to download PST CODE #1 for execution by the server resource 195-1, the controller 140 identifies a unique identifier value (such as network address XXX) assigned to the first server resource 195-1. Using map information 295 in FIG. 3, the controller 140 maps the unique identifier value XXX to the appropriate power supply test and test code (such as PST CODE #1) assigned to the server resource 195-1. The controller 140 retrieves a power supply test (including software instructions of PST CODE #1) to be executed during testing of the redundant power supply 120-1.

Referring again to FIG. 4, the controller 140 communicates the PST CODE #1 (software instructions) to the first server resource 195-1 to test that each of the first power supply 101-1 and the second power supply 102-1 are operable to individually deliver power to the load without failures.

Note that execution of the software instructions (such as software instructions associated with PST CODE #1) ensure that the server resource 195-1 consumes power above a threshold value (such as any suitable value between 50-100% of maximum possible power consumption by the server resource 195-1). In other words, the executable code PST CODE #1 is designed to operate the server resource 195-1 at or near maximum possible power consumption.

In one embodiment, loading and execution of the PST CODE #1 a server resource 195-1 instead of executing the SVR CODE #1, ensures that the server resource 195-1 test the redundant power supply 120-1 under high load or stressful load conditions as opposed to minimal load conditions.

Subsequent to downloading, the controller 140 controls the server resource 195-1 to execute the instructions associated with PST CODE #1.

While executing the software instructions associated with PST CODE #1, during a first portion of the power supply testing of the server resource 195-1, the controller 140 selects the first power supply 101-1 for testing. As previously discussed, the controller 140 may have disabled failure reporting of the second power supply 102-1 via communications to the server management resource 150-1. If not, the controller 140 disables failure reporting associated with the second power supply 102-1.

Via further communications over the communication link 228-1 to the server management resource 150-1, the controller 140 notifies the server management resource 150-1 to disable the second power supply 102-1 from delivering power to the first server resource 195-1. This ensures that only power supply 101-1 powers the respective server resource 195-1. Under such conditions, the controller 140 verifies an ability of the first power supply 101-1 to provide sufficient power to the server resource 195-1 (without the first power supply 101-1 failing) while the second power supply 102-1 is disabled from powering the first server resource 195-1.

In a similar manner as previously discussed, during the power supply test mode of operating only a single power supply to power the server resource 195-1, the server management resource 150-1 monitors any suitable information such as a temperature power supply 101-1, magnitude of voltage V1, current supplied by power supply 101-1 to power the server resource 195-1, etc. The controller 140 communicates with the server management resource 150-1 to retrieve this health status information.

The controller 140 analyzes the health status information received from the server management resource 150-1 to determine whether the power supply 101-1 has the ability to power the respective server resource 195-1 by itself.

If the controller 140 analyzes the health status information and does not detect a failure of the first power supply 101-1 during a respective window of testing, the controller 140 controls both the first power supply 101-1 and the second power supply 102-1 to collectively deliver power to the first server resource 195-1 again.

The controller 140 continues with testing the power supply 102-1 as further discussed below.

Note that because only server resource 195-1 is taken off-line for redundant power supply testing, the other server resources including server resource 195-2, server resource 195-3, etc., are able to provide uninterrupted delivery of content 232 requesting clients 210.

Additionally or alternatively, note that the controller 140 can be configured to communicate with the server management resource 150-1 to monitor an amount of power delivered to the server resource 195-1 from the active power supply 101-1. To determine the amount of power delivered, the controller 140 can be configured to communicate with the server management resource 150-1 to learn of an amount of current and voltage outputted by the respective power supply 101-1. If the power supply 101-1 must be able to supply 250 W (Watts) of power to the server resource 195-1, and feedback (such as voltage and current information) from the server management resource 150-1 indicates that the server resource 195-1 currently only consumes 150 W of power, the controller 140 can communicate over communication link 228-1 to the server management resource 150-1 and/or the server resource 195-1 to control additional settings of the server resource 195-1 to consume power at a level closer to the 250 W maximum power capacity consumption by server resource 195-1. For example, during the test mode of testing the power supply 101-1, the controller 140 can initiate turning ON a circuit or feature in the server resource 195-1 such that the server resource 195-1 consumes an additional 100 W of power to bring total consumption to 250 W.

Figure 5:
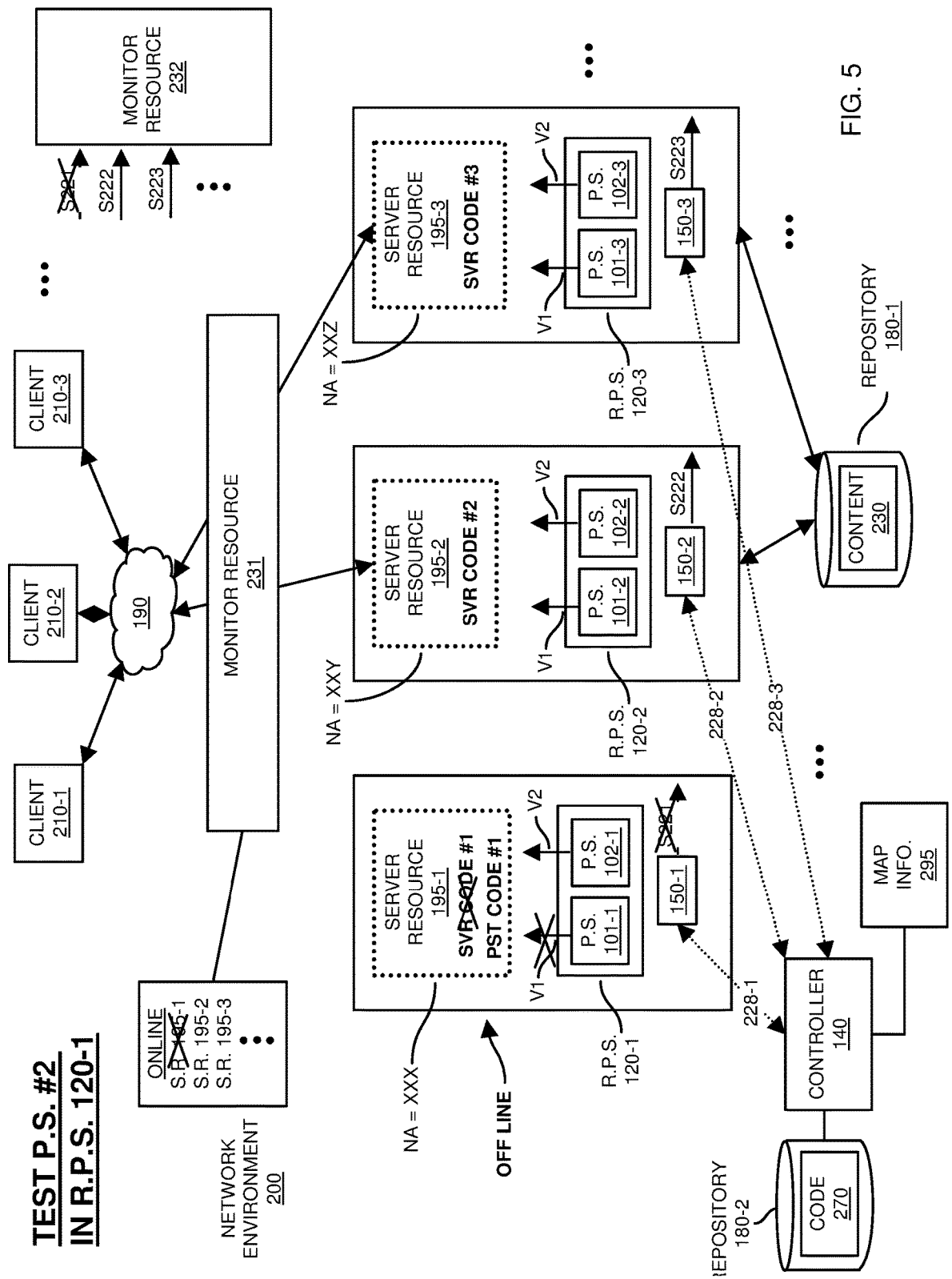
FIG. 5 is an example diagram illustrating testing of a second portion of a redundant power supply according to embodiments.

FIG. 5 is an example diagram illustrating testing of a second portion of a redundant power supply according to embodiments herein.

During a second portion of the power supply test mode in which the controller 140 tests the redundant power supply 120-1, the controller 140 selects the second power supply 102-1 for testing. As previously discussed, failure reporting of the first power supply 101-1 is disabled. If not, the controller 140 initiates disabling of failure notifications associated with power supply 101-1. Accordingly, none of the resources such as the server resource 195-1, monitor resource 231, server management resource 150-1, etc., generates or receives erroneous (or meaningless) failure messages associated with the power supply 101-1 while the redundant power supply 120-1 is operated in the test mode.

The controller 140 then disables (prevents) the first power supply 101-1 from delivering power to the first server resource 195-1. This ensures that the power supply 102-1 is the sole provider of power to the respective server resource 195-1 during testing.

While the first power supply 101-1 is disabled from powering the first server resource 195-1, the controller 140 tests and verifies an ability of the second power supply 102-1 to provide sufficient power to the server resource 195-1 (without the second power supply failing).

In a similar manner as previously discussed, during testing, the server management resource 150-1 monitors any suitable health status information such as a temperature power supply 102-1, magnitude of voltage V2, current supplied by power supply 102-1 to power the server resource 195-1, etc. The controller 140 receives and analyzes this health status information received from the server management resource 150-1.

If the controller 140 analyzes the health status information and does not detect a failure of the first power supply 102-1 during a window of testing, the controller 140 controls both the first power supply 101-1 and the second power supply 102-1 to collectively deliver power to the first server resource 195-1 again.

If there is a detected failure of redundant power supply 120-1 subsequent to completing the power supply test mode such as because either the first power supply 101-1 or the second power supply 102-1 fails, the controller 140 provides notification of the failure to a target recipient such as an administrator that will provide corrective action to replace the feeling redundant power supply 120-1 with a healthy redundant power supply.

Possible reporting of failures can include i) a detected inability of the first power supply 101-1 to power the first server resource 195-1 while the second power supply 102-1 is disabled from powering the first server resource 195-1 or ii) a detected inability of the second power supply 102-1 to power the first server resource 195-1 while the first power supply 101-1 is disabled from powering the first server resource 195-1.

Figure 6:
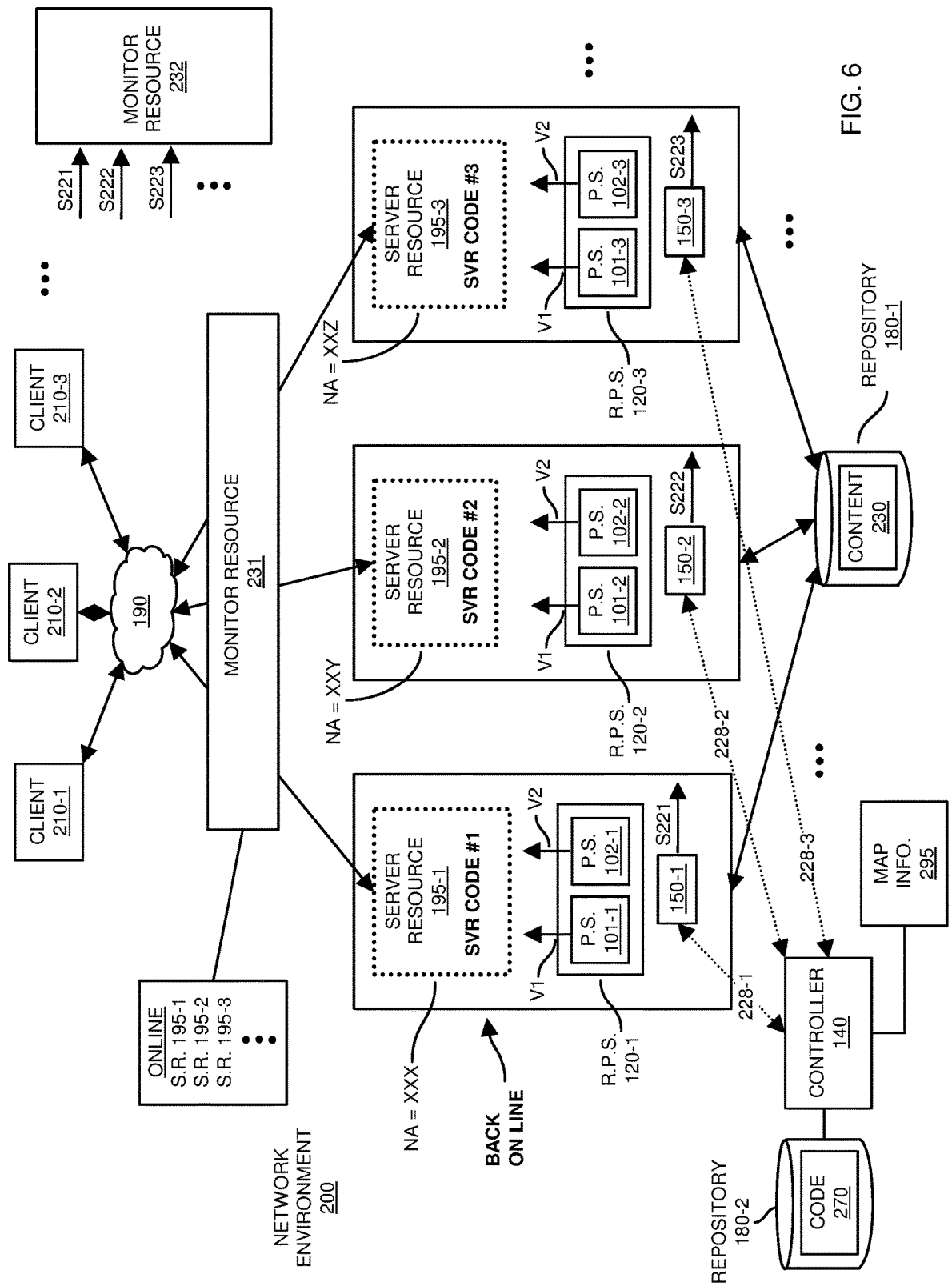
FIG. 6 is an example diagram illustrating activating the first server resource to an online state subsequent to testing of the redundant power supply according to embodiments herein.

FIG. 6 is an example diagram illustrating activating the first server resource to an online state subsequent to testing of the redundant power supply according to embodiments herein.

Assuming that there is no detected failure of the redundant power supply 120-1 (or either power supply) during the power supply test mode, the controller 140 communicates second software instructions (such as SVR CODE #1) to the first server resource 195-1 to operate the first server resource 195-1 in the non-test operational mode again in which the first server resource 195-1 is operable to retrieve and distribute content 230 to respective clients 210.

In addition to reloading the respective SVR CODE #1 into the server resource 195-1 for execution, the controller 140 notifies the monitor resource 231 (such as a load balancer) that the first server resource 195-1 is available again to serve the content 230 from the repository 180-1 to requesting clients 210 in accordance with the non-test operational mode. In such an instance, the multiple server resources 195 including the first server resource 195-1 distribute the content 230 to requesting clients 210.

In addition to activating the respective server resource 195-1, the controller 140 communicates with the server management resource 150-1 to enable automatic error notifications again to appropriate recipients. In such an instance, the server management resource 150-1 monitors operation of the server resource 195-1 and/or the redundant power supply 120-1 again for automatic distribution of status information S221 to recipients such as monitor resource 232.

Because the redundant power supply 120-1 has been tested, it can be assured that if one of the power supplies in the redundant power supply 120-1 suddenly fails, the other non-failing power supply will be able to appropriately power the server resource 195-1 so that the server resource 195-1 operates in an uninterrupted manner despite the failure. In response to detection of a new failure condition, newly generated status information S221 indicating the failure will provide immediate failure notification to appropriate parties of the failure.

Accordingly, embodiments herein include testing a respective redundant power supply to ensure that it will operate properly during a failure condition.

Figure 7:
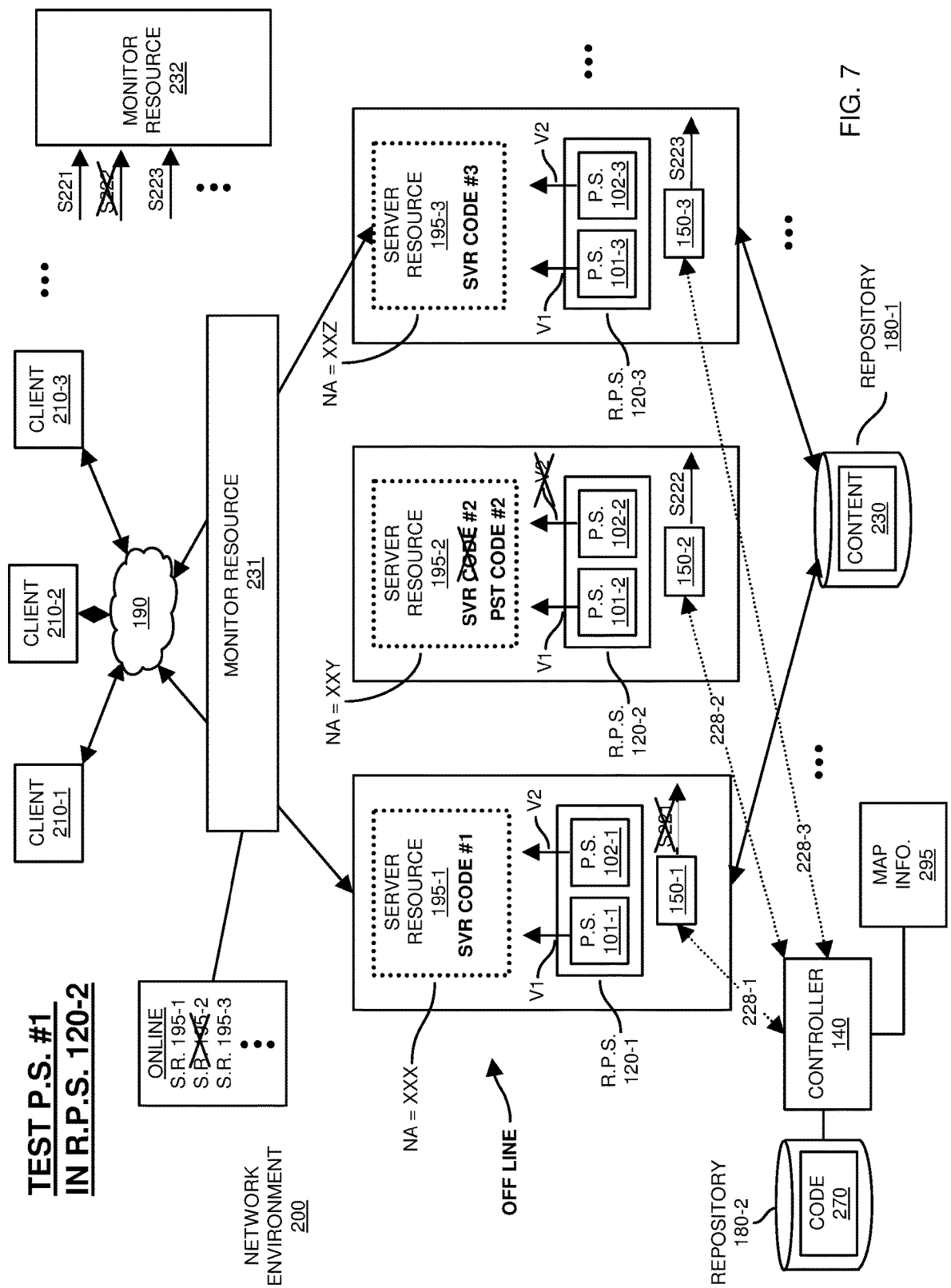
FIG. 7 is an example diagram illustrating testing of a first portion of a redundant power supply according to embodiments herein.

FIG. 7 is an example diagram illustrating testing of a first portion of a redundant power supply according to embodiments herein.

Subsequent to testing redundant power supply 120-1, the controller 140 initiates testing of redundant power supply 120-2 that powers server resource 195-2.

As previously discussed, in one embodiment, controller 140 occasionally or periodically tests each of the redundant power supplies to ensure that they are operating properly.

Assume in this example, in accordance with a schedule of testing redundant power supplies, that the controller 140 selects redundant power supply 120-2 for testing. As previously discussed, one or both of the power supply 101-2 or power supply 102-2 of the redundant power supply 120-2 is designed to individually power the respective server resource 195-2 (load).

Prior to executing a test with respect to the redundant power supply 120-2, the controller 140 or other suitable resource notifies monitor resource 231 (such as a load balancer) that the second server resource 195-2 will be taken off-line from distributing the content 230 to the requesting clients 210 in order to test the redundant power supply 120-2.

In response to receiving the notification, after completing attending to pending requests for content, the monitor resource 231 removes the server resource 195-2 as an available candidate for distributing content 230 to respective clients. Providing notification to the monitor resource 231 that the server resource 195-2 is being taken off-line ensures that the monitor resource 231 does not generate erroneous failure information associated with the server resource 195-2 and/or redundant power supply 120-2 as a result of the server resource 195-2 being placed in a test mode.

In addition to notifying the monitor resource 231 of promulgating potentially erroneous failure messages, the controller 140 communicates with the server management resource 150-2 to notify the server management resource 150-2 that the redundant power supply 120-2 is being placed in a test mode. In response to receiving the notification, the server management resource 150-2 discontinues outputting status information S222, which indicates the health status of the redundant power supply 120-2.

Accordingly, this preemptive move of disabling error message notification from one or more resources by the controller 140 ensures that neither the server management resource 150-2 nor any other resource in network environment 200 will not send out erroneous (or meaningless) failure messages during the testing of the redundant power supply 120-2.

Via further communications over communication link 228-2, the controller 140 then initiates downloading of PST CODE #2 to the server resource 195-2 for execution during the power supply test mode.

During the power supply test mode, in accordance with commands from the controller 140, the server resource 195-2 switches from an operational mode of executing SVR CODE #2 to serve clients 210 content 230 to operating in a power supply test mode in which the server resource does not serve the content 230 to the clients 210 but instead executes PST CODE #2 to test the redundant power supply 120-2.

In one embodiment, to download PST CODE #2 for execution by the server resource 195-2, the controller 140 identifies a unique identifier value (such as network address XXY) assigned to the server resource 195-2. Using map information 295 in FIG. 3, the controller 140 maps the unique identifier value XXY to the appropriate power supply test and test code (such as PST CODE #2) assigned to the server resource 195-2. The controller 140 retrieves a power supply test (including software instructions of PST CODE #2) to be executed during testing of the redundant power supply 120-2.

Referring again to FIG. 7, the controller 140 communicates the PST CODE #2 (software instructions) to the second server resource 195-2 to test that each of the power supply 101-2 and the power supply 102-2 are operable to individually deliver power to the load (server resource 195-2) without failures.

Note that execution of the software instructions (such as software instructions associated with PST CODE #2) ensure that the server resource 195-2 consumes power above a threshold value (such as any suitable value between 50-100% of maximum possible power consumption by the server resource 195-2).

In one embodiment, loading and execution of the PST CODE #2 at server resource 195-2 instead of executing the SVR CODE #2 at server resource 195-2, ensures that the server resource 195-2 tests the redundant power supply 120-2 under high load or stressful load conditions as opposed to minimal load conditions.

Subsequent to downloading and installing the PST CODE #2, the controller 140 controls the server resource 195-2 to execute the instructions associated with PST CODE #2.

While executing the software instructions associated with PST CODE #2, during a first portion of the power supply testing of the server resource 195-2, the controller 140 selects the power supply 101-2 for testing. As previously discussed, the controller 140 may have already disabled failure reporting of the power supply 102-2 via communications of the test to the server management resource 150-2 and the monitor resource 231. If not, the controller 140 goes forward with disabling failure reporting associated with the power supply 102-2.

In addition to disabling failure reporting, via further communications over the communication link 228-2 to the server management resource 150-2, the controller 140 notifies the server management resource 150-2 to disable the power supply 102-2 from delivering power to the server resource 195-2. This ensures that only power supply 101-2 powers the respective server resource 195-2 for a following test duration. Under such conditions of executing the PST CODE #2 and powering the respective server resource 195-2 using only the power supply 101-2, the controller 140 verifies an ability of the power supply 101-2 to provide sufficient power to the server resource 195-2.

In a similar manner as previously discussed, during the power supply test mode of operating only a single power supply to power the server resource 195-2, the server management resource 150-2 monitors (such as in a test window of time) any suitable information such as a temperature of power supply 101-2, a magnitude of voltage V1 produced a by power supply 101-2, an amount of current supplied by power supply 101-2 to power the server resource 195-2, etc. In one embodiment, the controller 140 communicates with the server management resource 150-1 to retrieve this health status information.

The controller 140 analyzes the health status information received from the server management resource 150-2 to determine whether the power supply 101-2 has the ability to power the respective server resource 195-2 by itself.

If the controller 140 analyzes the health status information and does not detect a failure of the power supply 101-2 during a respective window of testing, the controller 140 controls both the power supply 101-2 and the power supply 102-2 to collectively deliver power to the server resource 195-2 again. The controller 140 continues with testing the power supply 102-2 as further discussed below.

Note that because only server resource 195-2 is taken off-line for redundant power supply testing in this example, the other server resources including server resource 195-1, server resource 195-3, etc., are able to provide uninterrupted delivery of content 230 to requesting clients 210.

Figure 8:
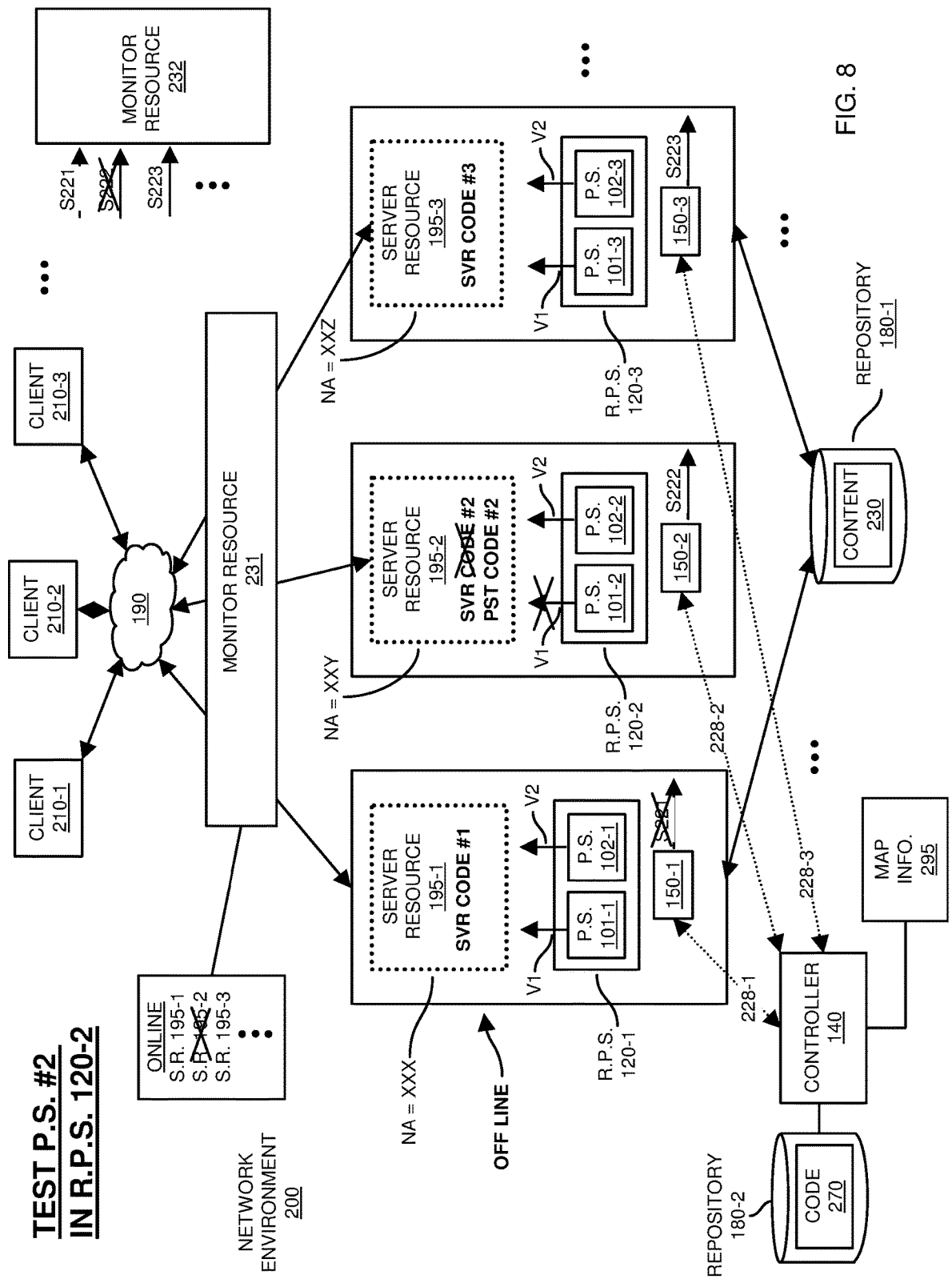
FIG. 8 is an example diagram illustrating testing of a second portion of a redundant power supply according to embodiments.

FIG. 8 is an example diagram illustrating testing of a second portion of a redundant power supply according to embodiments herein.

During a second portion of the power supply test mode in which the controller 140 tests the redundant power supply 120-2, the controller 140 selects the power supply 102-2 for testing. As previously discussed, failure reporting of the power supply 101-2 is disabled. If failure reporting of power supply 101-2 is not disabled, the controller 140 initiates disabling of failure notifications associated with power supply 101-2. Accordingly, because error reporting is disabled, none of the resources such as the server resource 195-2, monitor resource 231, server management resource 150-2, etc., generates or receives erroneous (or meaningless) failure messages while the redundant power supply 120-2 is operated in the test mode.

The controller 140 then disables (prevents) the power supply 101-2 from delivering power to the server resource 195-2. This ensures that the power supply 102-2 is the sole provider of power to the respective server resource 195-2 during testing.

While the power supply 101-2 is disabled from powering the server resource 195-2, the controller 140 tests and verifies an ability of the power supply 102-2 to provide sufficient power to the server resource 195-2 (without the power supply 102-2 failing). In a similar manner as previously discussed, during testing, the server management resource 150-2 monitors any suitable health status information such as a temperature of power supply 102-2, a magnitude of voltage V2, an amount of current supplied by power supply 102-2 to power the server resource 195-2, etc. The controller 140 receives and analyzes this health status information received from the server management resource 150-2.

If the controller 140 analyzes the health status information and does not detect a failure of the power supply 102-2 during a respective window of power supply testing, the controller 140 controls both the power supply 101-2 and the power supply 102-2 to collectively deliver power to the server resource 195-2 again.

If there is a detected failure of redundant power supply 120-2 subsequent to completing the power supply test mode (such as because either the power supply 101-2 or the power supply 102-2 fails, the controller 140 provides notification of the failure to a target recipient such as an administrator, technician, etc., that will provide corrective action to replace the feeling redundant power supply 120-2 with a healthy redundant power supply.

Possible reporting of failures can include i) a detected inability of the power supply 101-2 to power the server resource 195-2 while the power supply 102-2 is disabled from powering the server resource 195-2 or ii) a detected inability of the power supply 102-2 to power the server resource 195-2 while the power supply 101-2 is disabled from powering the server resource 195-2.

Figure 9:
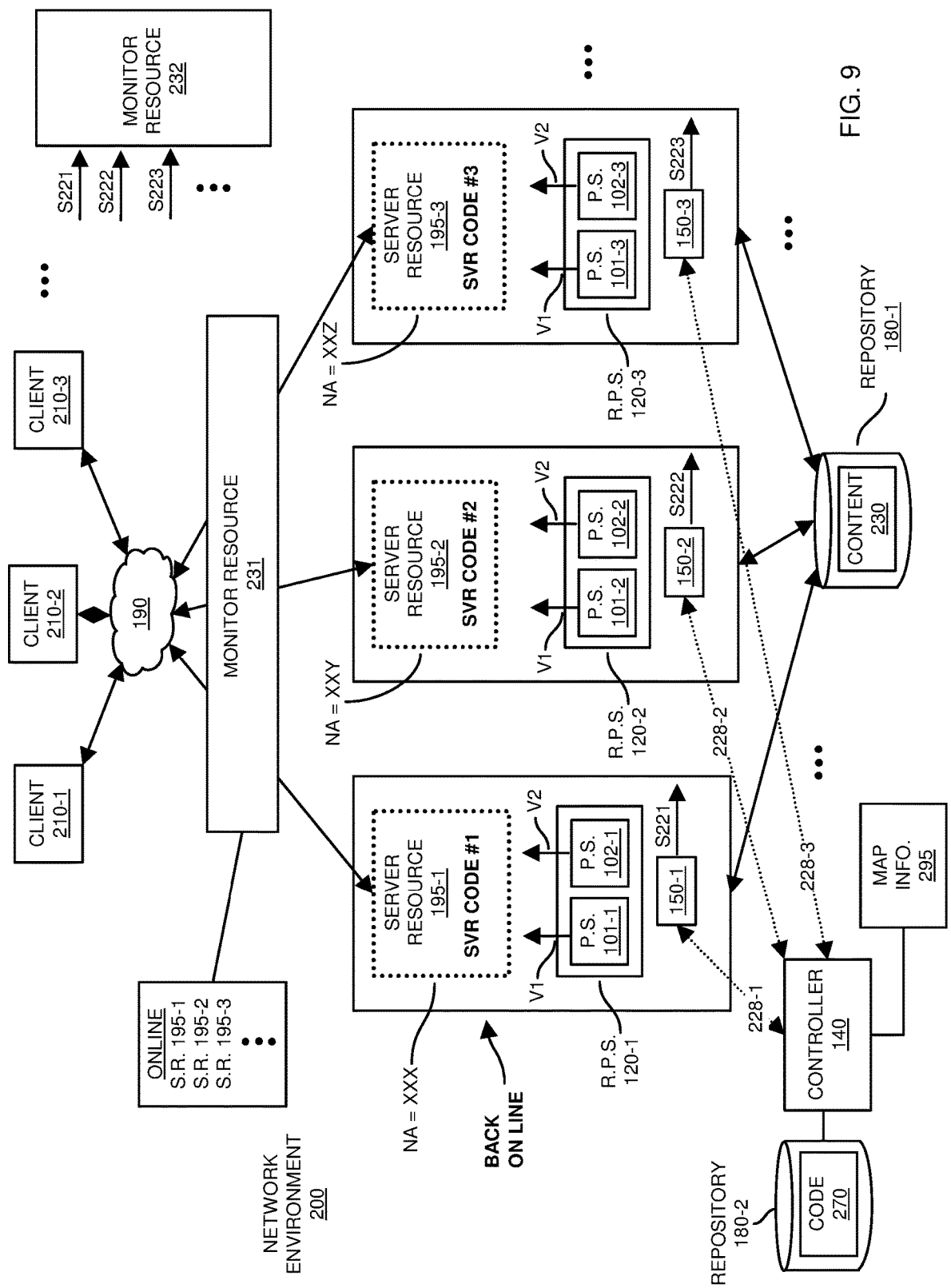
FIG. 9 is an example diagram illustrating activating a second server resource to an online state subsequent to testing of the redundant power supply according to embodiments herein.

FIG. 9 is an example diagram illustrating activating the second server resource to an online state subsequent to testing of the redundant power supply according to embodiments herein.

Assuming that there is no detected failure of the redundant power supply 120-2 (or either power supply) during the power supply test mode as previously discussed, the controller 140 communicates second software instructions (such as SVR CODE #2) to the server resource 195-2 to operate the server resource 195-2 in the non-test operational mode again in which the server resource 195-2 is operable to retrieve and distribute content 230 to respective clients 210.

In addition to reloading the respective SVR CODE #2 into the server resource 195-2 for execution, and actual execution of the respective SVR CODE #2, the controller 140 notifies the monitor resource 231 (such as a load balancer) that the server resource 195-2 is available again to serve the content 230 from the repository 180-1 to requesting clients 210 in accordance with the non-test operational mode. In such an instance, the multiple server resources 195, including the newly online server resource 195-2, collectively and simultaneously distribute the content 230 to requesting clients 210.

In addition to activating the respective server resource 195-2, the controller 140 communicates with the server management resource 150-2 to enable automatic error notifications again to recipients. In such an instance, the server management resource 150-2 monitors operation of the server resource 195-2 and/or the redundant power supply 120-2 again for automatic distribution of status information S222 to appropriate recipients such as monitor resource 232.

Because the redundant power supply 120-2 has been tested, it can be assured that if one of the power supplies in the redundant power supply 120-2 suddenly fails, the other non-failing power supply in the redundant power supply 120-2 will be able to appropriately power the server resource 195-2 so that the server resource 195-2 operates in an uninterrupted manner despite the failure. In response to detection of a new failure condition associated with the server resource 195-2, newly generated status information S222 indicating the failure will provide immediate failure notification to appropriate parties.

Figure 10:
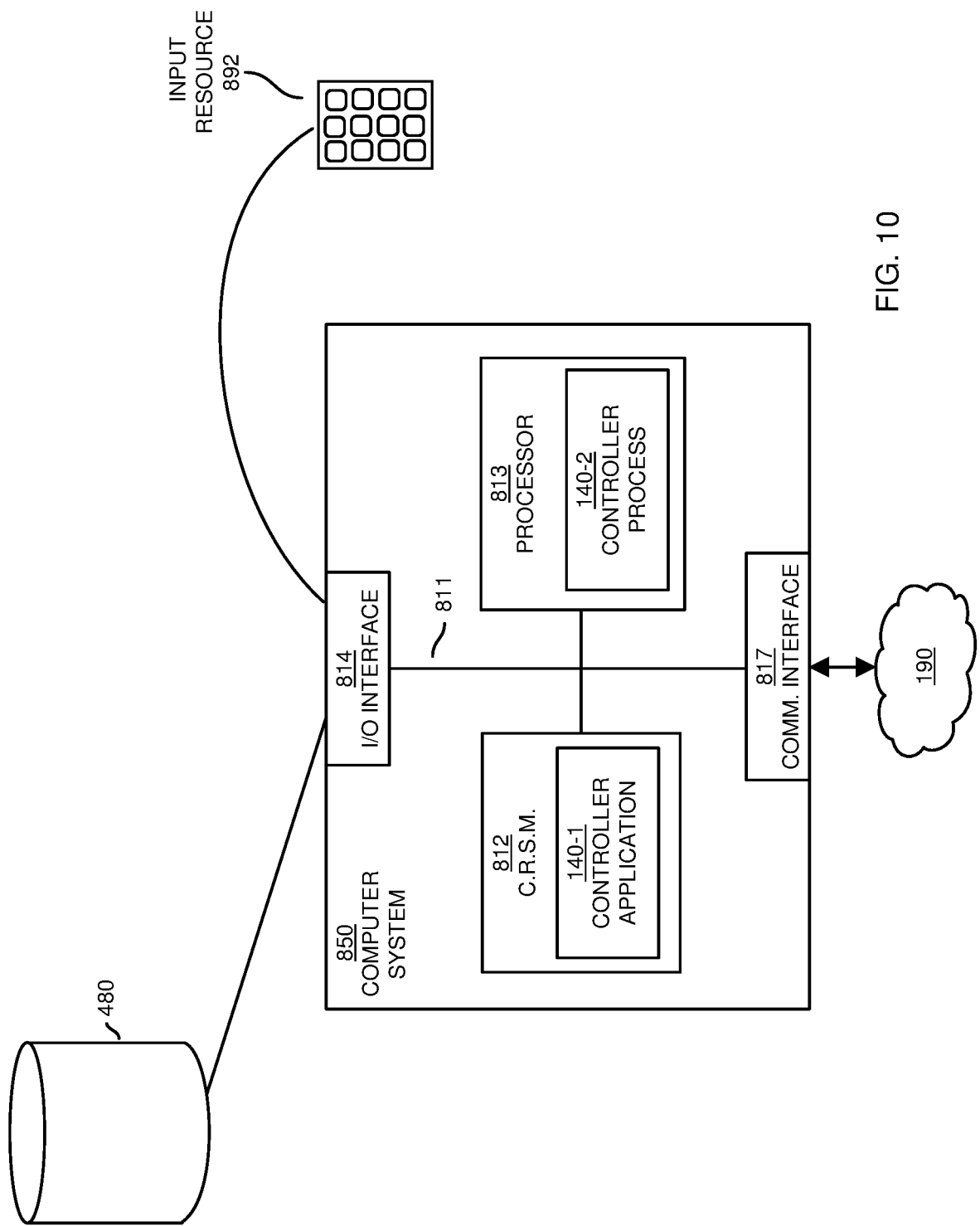
FIG. 10 is a diagram illustrating an example computer architecture to execute operations according to embodiments herein.

FIG. 10 is an example block diagram of a computer system for implementing any of the operations as discussed herein according to embodiments herein.

Any of the resources as discussed herein can be configured to include a processor and executable instructions to carry out the different operations as discussed herein.

As shown, computer system 850 (such as a respective server resource) of the present example can include an interconnect 811 that couples computer readable storage media 812 such as a non-transitory type of media (i.e., any type of hardware storage medium) in which digital information can be stored and retrieved, a processor 813, I/O interface 814, and a communications interface 817. I/O interface 814 supports connectivity to repository 480 and input resource 892.

Computer readable storage medium 812 can be any hardware storage device such as memory, optical storage, hard drive, floppy disk, etc. In one embodiment, the computer readable storage medium 812 stores instructions and/or data.

As shown, computer readable storage media 812 can be encoded with controller application 140-1 (e.g., including instructions) to carry out any of the operations as discussed herein.

During operation of one embodiment, processor 813 accesses computer readable storage media 812 via the use of interconnect 811 in order to launch, run, execute, interpret or otherwise perform the instructions in controller application 140-1 stored on computer readable storage medium 812. Execution of the controller application 140-1 produces controller process 140-2 to carry out any of the operations and/or processes as discussed herein.

Those skilled in the art will understand that the computer system 850 can include other processes and/or software and hardware components, such as an operating system that controls allocation and use of hardware resources to controller application 140-1.

In accordance with different embodiments, note that computer system may be or included in any of various types of devices, including, but not limited to, a mobile computer, a personal computer system, a wireless device, base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, set-top box, content management device, handheld remote control device, any type of computing or electronic device, etc. The computer system 850 may reside at any location or can be included in any suitable resource in any network environment to implement functionality as discussed herein.

Functionality supported by the different resources will now be discussed via flowcharts in FIG. 11. Note that the steps in the flowcharts below can be executed in any suitable order.

FIG. 11 is a flowchart 1100 illustrating an example method according to embodiments. Note that there will be some overlap with respect to concepts as discussed above.

In processing operation 1110, during a first portion of a power supply test, the controller 140 selects a first power supply 101 of a redundant power supply 120 for testing.

In processing operation 1120, the controller 140 disables failure reporting such as failure reporting of a second power supply 102 of the redundant power supply 120 under test.

In processing operation 1130, the controller hardware 140 tests an ability of the first power supply 101 to power a respective circuit load 125 of server resource 195 while the second power supply is disabled from powering the circuit load 125. The controller 140 activates the second power supply 102 again along with activation of the first power supply 101 to power the load 125.

In processing operation 1140, during a second portion of the power supply test mode, the controller hardware 140 selects the second power supply 102 for testing.

In processing operation 1150, the controller hardware 140 disables failure reporting of the first power supply 101.

In processing operation 1160, the controller hardware 140 tests an ability of the second power supply 102 to power the load 125 while the first power supply 102 is disabled from powering the load 125. Subsequent to testing the second power supply 102, the controller 140 activates the first power supply 101 again along with activation of the second power supply 102 to power the load 125 (such as server resource and related circuitry).

Note again that techniques herein are well suited to support testing of redundant power supplies without impacting operation of a respective communication system including one or more server resources to distribute content. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

I claim:

1. A method of testing redundant power supplies including a first power supply and a second power supply that collectively operate to power a load during a non-test operational mode, the method comprising:
via a first portion of a power supply test mode:
selecting the first power supply for testing;
disabling the second power supply from powering the load during the testing;
while the second power supply is disabled from powering the load during the testing of the first power supply:
i) disabling reporting of failures of the second power supply to a monitor resource that monitors an operational status of the first power supply and the second power supply; and
ii) testing an ability of the first power supply to power the load.

2. The method as in claim 1 further comprising:
subsequent to completion of testing the ability of the first power supply to supply power to the load while the second power supply is disabled: i) controlling the first power supply and the second power supply to power the load again, and ii) enabling reporting of failures associated with the second power supply to the monitor resource.

3. The method as in claim 1 further comprising:
via a second portion of the power supply test mode:
selecting the second power supply for testing;
disabling reporting of failures associated with the first power supply to the monitor resource; and
testing an ability of the second power supply to power the load while the first power supply is disabled from powering the load.

4. The method as in claim 3 further comprising:
subsequent to individually testing the first power supply and the second power supply to power the load, controlling a combination of the first power supply and the second power supply to redundantly power the load in response to detecting that both the first power supply and the second power supply pass the individual testing.

5. The method as in claim 3, wherein testing the ability of the first power supply includes: while the second power supply is disabled from powering the load, verifying the ability of the first power supply to provide sufficient power to the load without the first power supply failing; and
wherein testing the second power supply includes: while the first power supply is disabled from powering the load, verifying the ability of the second power supply to provide sufficient power to the load without the second power supply failing.

6. The method as in claim 1, wherein the load is a server resource, the method further comprising:
controlling the server resource to switch from an operational mode of serving clients requested content to operating in the power supply test mode in which the server resource does not serve the content to the clients; and
communicating software instructions to the load for execution during the power supply test mode, execution of the software instructions during the power supply test mode controlling power consumption by the server resource to be above a threshold value.

7. The method as in claim 1, wherein the load powered by the first power supply is a first server of multiple servers in a network operable to distribute content stored in a repository accessible to each of the multiple servers; and
wherein disabling reporting of failures of the second power supply includes: communicating a notification to a load balancer that the first server is placed in the power supply test mode, the notification preventing the load balancer from selecting the first server to serve the content stored in the repository to clients.

8. The method as in claim 7, wherein disabling reporting of failures includes: notifying the first server to discontinue reporting any detected errors associated with the first power supply during the testing of the ability of the first power supply to power the load.

9. The method as in claim 8 further comprising:
controlling the first server resource to switch from an operational mode of serving clients requested content to operating in the power supply test mode in which the first server resource does not serve the content to the clients; and
communicating software instructions to the load for execution during the power supply test mode, execution of the software instructions during the power supply test mode controlling power consumption by the server resource to be above a threshold value.

10. The method as in claim 1 further comprising:
breaking out of a loop of repeatedly testing attributes of the first power supply in response to detecting a failure associated with the first power supply during delivery of power from the first power supply to the load.

11. The method as in claim 1, wherein the load is a first server of multiple servers that share a task of distributing content from a repository to multiple clients, the first server operable to deliver content to clients during the non-test operational mode, the method further comprising:
subsequent to completing the power supply test mode of testing of the first power supply and the second power supply, notifying a load balancer controlling the first server that the first server is available again to serve the content from the repository to requesting clients.

12. The method as in claim 1, wherein testing the ability of the first power supply includes:
identifying a unique identifier value assigned to the load powered by the first power supply and the second power supply;
mapping the unique identifier value to a power supply test assigned to the load; and
executing the power supply test at the load to test that each of the first power supply and the second power supply, which are operable to individually deliver power to the load without failures.

13. The method as in claim 12, wherein the power supply test mode includes software instructions; and
wherein executing the power supply test mode includes communicating the software instructions over a communication link to the load, the load executing the software instructions during the testing of the ability of the first power supply to power the load.

14. The method as in claim 1, wherein the failures indicate an inability of the second power supply to power the load.

15. The method as in claim 1, wherein disabling the reporting of failures of the second power supply ensures that the monitor resource is not notified that the second power supply fails as a result of being disabled during the first portion of the power supply test mode.

16. The method as in claim 15, wherein the disabling of the second power supply from powering the load simulates a failure of the second power supply.

17. The method as in claim 1 further comprising:
in response to detecting an inability of the first power supply to power the load during the first portion of the power supply test mode, providing notification that the first power supply fails.

18. The method as in claim 1, wherein testing the ability of the first power supply to power the load includes: receiving status information indicating a voltage magnitude of the first power supply and a magnitude of current supplied by the first power supply.

19. The method as in claim 18 further comprising:
deactivating the first power supply in response to detecting a failure condition as indicated by the status information.

20. A system comprising:
a server resource operable to distribute content to clients in a network, the server resource powered by a redundant power supply including a first power supply and a second power supply during a non-test operational mode; and
controller hardware in communication with the server resource to control modal operation of the server resource to test the redundant power supply, the controller hardware operable to, during a power supply test mode:
select the first power supply for testing;
disable the second power supply from powering the server resource during the testing; and
while the second power supply is disabled from powering the server resource:
i) disable reporting of failure status information associated with the second power supply to a monitor resource that monitors the redundant power supply; and
ii) test an ability of the first power supply to power the server resource.

21. The system as in claim 20, wherein the controller hardware is further operable to:
subsequent to completion of testing the ability of the first power supply to supply power to the server resource: i) control the first power supply and the second power supply to collectively power the server resource again, and ii) enable reporting of the failure status information associated with second power supply to the monitor resource.

22. The system as in claim 20, wherein the controller hardware is further operable to:
during the power supply test mode:
subsequent to testing the ability of the first power supply to power the server resource, select the second power supply for testing;
disable reporting of failure status information associated with the first power supply to the monitor resource; and
test an ability of the second power supply to power the server resource while the first power supply is disabled from powering the server resource.

23. The system as in claim 22, wherein the controller hardware is further operable to:
subsequent to individually testing the first power supply and the second power supply to power the server resource, controlling a combination of the first power supply and the second power supply to redundantly power the server resource in response to detecting that both the first power supply and the second power supply pass the individual testing.

24. The system as in claim 22, wherein the controller hardware is further operable to:
while the second power supply is disabled from powering the server resource, verify the ability of the first power supply to provide sufficient power to the server resource without the first power supply failing; and
while the first power supply is disabled from powering the server resource, verifying the ability of the second power supply to provide sufficient power to the server resource without the second power supply failing.

25. The system as in claim 20, wherein the controller hardware is further operable to:
control the server resource to switch from an operational mode of serving clients requested content to operating in the power supply test mode in which the server resource is offline from serving the content to the clients; and
communicate software instructions to the server resource for execution during the power supply test mode, execution of the software instructions during the power supply test mode controlling power consumption by the server resource to be above a threshold value.

26. The system as in claim 20, wherein the server resource powered by the redundant power supply is a first server of multiple servers in a network operable to distribute content stored in a repository accessible to each of the multiple servers; and
wherein the controller hardware is further operable to:
communicate a notification to a load balancer that the first server is placed in the power supply test mode, the notification preventing the load balancer from selecting the first server to serve the content stored in the repository to the clients during the power supply test mode.

27. The system as in claim 26, wherein the controller hardware is further operable to:
notify the first server to discontinue reporting any detected errors associated with the first power supply during the testing of the first power supply.

28. The system as in claim 20, wherein the controller hardware is further operable to:
break out of a loop of repeatedly testing attributes of the first power supply during the power supply test mode in response to detecting a failure associated with the first power supply during delivery of power from the first power supply to the server resource.

29. The system as in claim 20, wherein the server resource is a first server of multiple servers that share a task of distributing content from a repository to multiple clients, the first server operable to deliver content to clients during the non-test operational mode;
wherein the controller hardware is further operable to:
subsequent to completing testing of the first power supply and the second power supply during the test mode, notify a load balancer controlling the first server that the first server is available again to serve the content from the repository to requesting clients.

30. The system as in claim 20, wherein the controller hardware is further operable to:
identify a unique identifier value assigned to the server resource powered by the first power supply and the second power supply;
map the unique identifier value to a power supply test assigned to the server resource; and execute the power supply test at the server resource to test that each of the first power supply and the second power supply are operable to individually deliver power to the server resource without failures.

31. The system as in claim 30, wherein the power supply test includes software instructions; and
wherein the controller hardware is further operable to:
communicate the software instructions over a communication link to the server resource, the server resource executing the software instructions during testing of the first power supply.

* * * * *